(12) United States Patent
DeHaven et al.

(10) Patent No.: US 7,291,516 B2
(45) Date of Patent: Nov. 6, 2007

(54) LOW TEMPERATURE MELT-PROCESSING OF ORGANIC-INORGANIC HYBRID

(75) Inventors: Patrick W. DeHaven, Poughkeepsie, NY (US); David R. Medeiros, Ossining, NY (US); David B. Mitzi, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/446,358

(22) Filed: Jun. 5, 2006

(65) Prior Publication Data

US 2006/0234480 A1    Oct. 19, 2006

Related U.S. Application Data

(62) Division of application No. 10/094,351, filed on Mar. 8, 2002, now Pat. No. 7,105,360.

(51) Int. Cl.
*H01L 21/31* (2006.01)
*H01L 51/40* (2006.01)
*C07F 5/00* (2006.01)

(52) U.S. Cl. .................. 438/99; 438/509; 438/781; 257/E21.411; 252/301.16; 534/15

(58) Field of Classification Search .............. 438/99, 438/509, 781; 257/E21.411; 252/301.16; 534/15
See application file for complete search history.

(56) References Cited

U.S. PATENT DOCUMENTS

| 4,829,116 | A |   | 5/1989  | Piesold |        |
|-----------|---|---|---------|---------|--------|
| 5,681,870 | A | * | 10/1997 | Keller et al. ................. | 522/99 |
| 5,871,579 | A |   | 2/1999  | Liang et al. |  |
| 5,882,548 | A |   | 3/1999  | Liang et al. |  |
| 6,107,454 | A |   | 8/2000  | Schmieg et al. |  |
| 6,117,498 | A |   | 9/2000  | Chondroudis et al. |  |
| 6,180,956 | B1 |  | 1/2001  | Chondroudis et al. |  |
| 6,231,974 | B1 | * | 5/2001  | Yamakawa et al. ......... | 428/354 |
| 6,476,098 | B1 | * | 11/2002 | Arakawa et al. ............. | 523/206 |
| 6,498,400 | B2 | * | 12/2002 | Yamakawa et al. ......... | 257/787 |

(Continued)

FOREIGN PATENT DOCUMENTS

JP    2000-202906    7/2000

(Continued)

OTHER PUBLICATIONS

"Synthesis, Structure, and Properties of Organic-Inorganic Perovskites and Related Materials" David B. Mitzi *Progress in Organic Chemistry* vol. 48, 1999.

(Continued)

*Primary Examiner*—Michael Lebentritt
*Assistant Examiner*—Ron Pompey
(74) *Attorney, Agent, or Firm*—Connolly Bove Lodge & Hutz LLP; Ido Tuchman

(57) ABSTRACT

The present invention provides a process for preparing a melt-processed organic-inorganic hybrid material including the steps of maintaining a solid organic-inorganic hybrid material at a temperature above the melting point but below the decomposition temperature of the organic-inorganic hybrid material for a period of time sufficient to form a uniform melt and thereafter, cooling the uniform melt to an ambient temperature under conditions sufficient to produce the melt-processed organic-inorganic hybrid material.

22 Claims, 11 Drawing Sheets

U.S. PATENT DOCUMENTS 6,569,933 B1     5/2003     Tonnvik et al.

FOREIGN PATENT DOCUMENTS

| JP | 2000-260999 A | 9/2000 |
| JP | 3310221 B2 | 5/2002 |
| JP | 2001-220143 A | 9/2004 |

OTHER PUBLICATIONS

"Dalton: Incorporating Acta Chemica Scandinavica: An International Journal of Inorganic Chemistry (Reprint)" David B. Mitzi, www.r.s.c.org/dalton, *Royal Society of Chemistry*.

"Low-Temperature Melt Processing of Organic-Inorganic Hybrid Films", David B. Mitzi et al., *Chemistry of Materials*.

"Synthesis, Crystal Structure, and Optical and Thermal Properties of $(C_4HgNH_3)_2MI_4$(M=Ge, Sn, Pb)" David B. Mitzi et al., *Chemistry of Materials*, vol. 8, No. 3, pp. 791-800.

"Transport, Optical, and Magnetic Properties of the Conducting Halide Perovskite $CH_3NH_3SnI_3$" David B. Mitzi et al., *Journal of Solid State Chemistry*, vol. 114, pp. 159-163, 1995.

"Conducting Tin Halides with a Layered Organic-based Perovskite Structure" David B. Mitzi et al., *Letter to Nature*, vol. 369, Jun. 9, 1994.

"Structually Tailored Organic-Inorganic Perovskited: Optical Properties and Solution-Processed Channel Material for Thin-Film Transistors" David B. Mitzi et al., *Chemistry of Materials*, vol. 13, pp. 3728-3740, 2001.

"Electroluminescence from an Organic-Inorganic Perovskite Incorporation of Quaterthiophene Dye within Lead Halide Perovskite Layers" Konstantinos Chondroudis et al., *Chemistry of Materials*, vol. 11, No. 11, pp. 3028-3030.

"Dipentylamine-Modified Polyborazylene: A New, Melt-Spinnable Polymeric Precursor to Boron Nitride Ceramic Fibers", Thomas Wideman et al., *Chemistry of Materials*, vol. 8, pp. 3-5, 1996.

"Dot-Matrix Display Using Organic Light-Emitting Diodes" T. Wakimoto et al., *Journal of SID*, 5/3, 1997.

"Double Injection Electroluminescence in Anthracene" J. Dresner, RCE Laboratories, Princeton, NJ.

"On the Thermal Decomposition of $(C_nH_{2n}-_1NH_3)_2MnCl_4$ Compounds with n 10 in a Dynamic Temperature Regime" by M.J. Tello et al., *Thermochimica Acta*, vol. 11, pp. 96-100, 1975.

"Temperature-Independent Transport in High-Mobility Pentacene Transistors" S.F. Nelson et al., *Applied Physics Letter*, vol. 72, No. 15, Apr. 1998.

"Organic-Inorganic Perovskite Semiconductors: Chemistry, Properties and Device Applications" David B. Mitzi et al., *Symposium: Organic and Molecular Electronics, PHYS*, paper No. 28, Apr. 7, 2002.

"Some Organic-Inorganic Hybrid Semiconductors Obtained from Melts" G.C. Papavassoliou et al., A. Graja et al. (eds). Molecular Low Dimensional and Nanostructured Materials for Advanced Application, 319-322, Kluwer Academic Publishers, Netherlands 2002.

* cited by examiner (a)        (b)

LOW TEMPERATURE MELT-PROCESSING OF ORGANIC-INORGANIC HYBRID

This application is a Divisional of U.S. application Ser. No. 10/094,351 filed Mar. 8, 2002, now U.S. Pat. No. 7,105,360.

BACKGROUND OF THE INVENTION

1. Field of the Invention

The present invention relates to a process for preparing a melt-processed organic-inorganic hybrid material and a method of preparing an improved field-effect transistor including a melt-processed organic-inorganic hybrid material. More particularly, the present invention relates to a process for preparing a melt-processed perovskite material and a method of preparing an improved field-effect transistor including a melt-processed perovskite material.

2. Description of the Prior Art

Organic materials have received considerable recent attention as potential replacements for inorganic counterparts in flat panel display driver circuitry and light-emitting elements, as well as for enabling technology for flexible and low-cost electronic devices. Organic materials have the advantage of simple and low-temperature thin-film processing through inexpensive techniques such as spin coating, ink jet printing, or stamping. In addition, the flexibility of organic chemistry enables the formation of organic molecules with useful luminescent and conducting properties. Since the first consideration of organic electroluminescence (EL) devices over 30 years ago (J. Dresner, *RCA Rev.* 30, 322 (1969)), organic light-emitting devices (OLEDs) have been widely pursued and near-commercial dot-matrix displays have recently been demonstrated (T. Wakimoto, et. al., *J. Soc. Info. Display* 5, 235 (1997)). In addition to emitting light, the semiconducting properties of some organic materials enable promising technologies for organic field effect transistors (OFETs). Over the last few years, the carrier mobilities of organic channel layers in OFETs have increased dramatically from <$10^{-4}$ to ~1 cm$^2$N-sec (comparable to amorphous silicon) (S. F. Nelson, et. al., *Appl. Phys. Lett.* 72, 1854 (1998) and C. D. Dimitrakopoulos, et. al., *Science* 283, 822 (1999)).

While promising with regard to processing, cost, and weight considerations, organic compounds generally have a number of disadvantages, including poor thermal and mechanical stability. Electrical transport in organic materials has improved substantially over the last 15 years. However, the mobility is fundamentally limited by the weak van der Waals interactions between organic molecules (as opposed to the stronger covalent and ionic forces found in extended inorganic systems). In OLEDs, the stability and mobility limitations lead to reduced device lifetime. For OFETs, the inherent upper bound on electrical mobility translates to a cap on switching speeds and therefore on the types of applications that might employ the low-cost organic devices. If these issues could adequately be addressed, new technologies might be enabled by alternative semiconductors, including light, flexible displays or electronics constructed entirely on plastic.

Organic-inorganic hybrid materials, including particularly materials of the perovskite family, represent an alternative class of materials that may combine desirable physical properties characteristic of both organic and inorganic components within a single molecular-scale composite.

The basic structural motif of the perovskite family is the ABX$_3$ structure, which has a three-dimensional network of corner-sharing BX$_6$ octahedra. The B component in the ABX$_3$ structure is a metal cation that can adopt an octahedral coordination of X anions. The A cation is situated in the 12-fold coordinated holes between the BX$_6$ octahedra and is most commonly inorganic. By replacing the inorganic A cation with an organic cation, an organic-inorganic hybrid perovskite can be formed.

In these ionic compounds, the organic component is an intimate part of the structure, since the structure actually depends on the organic cation for charge neutrality. Therefore, such compounds conform to specific stoichiometries. For example, if X is a monovalent anion such as a halide, and A is a monovalent cation, then B should be a divalent metal. Layered, two-dimensional A$_2$BX$_4$, ABX$_4$ and one-dimensional A$_3$BX$_5$, A$_2$A'BX$_5$ perovskites also exist and are considered derivatives of the three-dimensional parent family.

The layered perovskites can be viewed as derivatives of the three-dimensional parent members, with y-layer-thick cuts, i.e., y=1, 2, 3 or more, from the three-dimensional structure interleaved with organic modulation layers. The layered compounds generally have inorganic layers with either <100> or <110> orientation relative to the original three-dimensional perovskite structure.

One <100>-oriented family of organic-inorganic perovskites has the general layered formula:

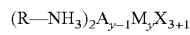

(R—NH$_3$)$_2$A$_{y-1}$M$_y$X$_{3y+1}$ where M is a divalent metal, X is a halogen atom (i.e. Cl, Br, I), A is a small inorganic or organic cation (e.g. Cs$^+$, CH$_3$NH$_3^+$), R—NH$_3^+$ is a larger aliphatic or aromatic mono-ammonium cation, and y is an integer defining the thickness of the inorganic layers. In this system, the ammonium group is hydrogen-bonded and ionically bonded to the inorganic sheet halogens, with the organic tail extending into the space between the layers and holding the structure together via Van der Waals interactions.

The (R—NH$_3$)$_2$MX$_4$ (y=1) members of this family include the simplest and most numerous examples of organic-inorganic perovskites. Similar y=1 (or higher y) layered perovskite structures can also be stabilized by diammonium cations, yielding compounds with the general formula (NH$_3$—R—NH$_3$)MX$_4$. In these systems, there is no Van der Waals gap between the layers since the ammonium groups of each organic layer hydrogen bond to two adjacent inorganic layers.

D. B. Mitzi, *Prog. Inorg. Chem.,* 48, 1 (1999) reviews the state of the art and describes organic-inorganic perovskites that combine the useful properties of organic and inorganic materials within a single molecular-scale composite. U.S. Pat. No. 5,882,548 to Liang et al. describes solid state preparation of perovskites based on divalent metal halide sheets. U.S. Pat. No. 6,180,956 B1 to Chondroudis et al. and C. R. Kagan et al., *Science,* 286, 945 (1999) describe integrating the self-assembling nature of organic materials with the high carrier mobilities characteristic of inorganic materials for possible use in Organic-Inorganic Field-Effect Transistors (OIFET's). A semiconductor-metal transition and high carrier mobility in the layered organic-inorganic perovskites based on a tin(II) iodide framework have also been described. These materials may be used as channel materials for field-effect transistors. K. Chondroudis et al., *Chem. Mater.;* 11, 3028 (1999) describe single crystals and thin films of the hybrid perovskites, which can be employed in Organic-Inorganic Light-Emitting Devices (OILED's).

The organic-inorganic hybrid materials, such as perovskites, may be processed to produce organic-inorganic perovskite crystals or thin films by conventional methods including the solution-based or evaporative techniques described by D. B. Mitzi in the previously cited *Prog. Inorg. Chem.*, 48, 1 (1999) and by Liang et al. in U.S. Pat. No. 5,871,579. However, these methods suffer from being high cost processing methods and generally require the use of environmentally hazardous solvents.

Accordingly, it is an object of the present invention to provide low-cost, melt-processed organic-inorganic hybrid materials, which can be used in a variety of applications, including flat panel displays, non-linear optical/photoconductive devices, chemical sensors, emitting and charge transporting layers in organic-inorganic light-emitting diodes, organic-inorganic thin-film transistors and as channel layers in organic-inorganic field-effect transistors.

These and other objects of the present invention will become apparent by the novel perovskite compositions and the methods of preparing the perovskite compositions.

SUMMARY OF THE INVENTION

The present invention provides a process for preparing a melt-processed organic-inorganic hybrid material including the steps of:

maintaining an organic-inorganic hybrid material at a temperature above the melting point but below the decomposition temperature of the organic-inorganic hybrid material for a period of time sufficient to form a uniform melt; and cooling the uniform melt to an ambient temperature under conditions sufficient to produce the melt-processed organic-inorganic hybrid material.

The present invention further provides a process for preparing a melt-processed organic-inorganic hybrid material including the steps of:

applying onto a substrate an organic-inorganic hybrid material;

maintaining the substrate and/or the organic-inorganic hybrid material at a temperature above the melting point of the organic-inorganic hybrid material but below the decomposition temperature of the organic-inorganic hybrid material and the substrate for a period of time sufficient to form a uniform melt; and cooling the substrate and/or uniform melt to an ambient temperature under conditions sufficient to form the melt-processed organic-inorganic hybrid material.

The present invention still further provides a process for preparing a laminated melt-processed organic-inorganic hybrid material, including the steps of:

applying onto a substrate an organic-inorganic hybrid material;

maintaining the substrate and/or the organic-inorganic hybrid material at a temperature above the melting point of the organic-inorganic hybrid material but below the decomposition temperature of the organic-inorganic hybrid material and the substrate for a period of time sufficient to form a uniform melt;

laminating a protective layer of a material on the uniform melt to produce a composite structure; and cooling the composite structure to an ambient temperature under conditions sufficient to produce the laminated melt-processed organic-inorganic hybrid material.

Additionally, the present invention provides the following processes for preparing a melt-processed organic-inorganic hybrid material:

(1) a process for preparing a melt-processed organic-inorganic hybrid material including the steps of:

melt-spinning an organic-inorganic hybrid material onto a substrate; and cooling the substrate and/or uniform melt to an ambient temperature under conditions sufficient to form the melt-processed organic-inorganic hybrid material;

(2) a process for preparing a melt-processed organic-inorganic hybrid material including the steps of:

melt-dipping a substrate into a uniform melt of an organic-inorganic hybrid material to produce a melt-dipped substrate; and cooling the melt-dipped substrate to an ambient temperature under conditions sufficient to form the melt-processed organic-inorganic hybrid material;

(3) a process for preparing a melt-processed organic-inorganic hybrid material including the steps of:

extruding an organic-inorganic hybrid material through a heated extruder; and cooling to an ambient temperature under conditions sufficient to form the melt-processed organic-inorganic hybrid material; and (4) a process for preparing a melt-processed organic-inorganic hybrid material including the steps of:

capillary-filling a uniform organic-inorganic hybrid material melt into a narrow space capable of capillary action with or without the use of vacuum; and cooling to an ambient temperature under conditions sufficient to form the melt-processed organic-inorganic hybrid material.

The present invention still further provides a method of preparing an improved field-effect transistor of the type having a source region and a drain region, a channel layer extending between the source region and the drain region, the channel layer including a semiconducting organic-inorganic hybrid material, a gate region disposed in spaced adjacency to the channel layer, an electrically insulating layer between the gate region and the source region, drain region and channel layer. The improvement includes:

preparing a channel layer including a melt-processed semiconducting organic-inorganic hybrid material by a process including the steps of:

maintaining an organic-inorganic hybrid material at a temperature above the melting point but below the decomposition temperature of the organic-inorganic hybrid material for a period of time sufficient to form a uniform melt; and cooling the uniform melt to an ambient temperature under conditions sufficient to produce the melt-processed organic-inorganic hybrid material.

The present invention provides low-cost, melt-processed organic-inorganic hybrid materials, which have the advantages of being low cost. In addition, because they are fabricated without the use of a solvent, they are less of a hazard to the environment. Melt-processing can be adapted to roll-to-roll manufacturing processes. Melt-processing also allows control of the grain size of the organic-inorganic hybrid materials. Further, melt-processing allows the preparation of a laminated layer between two substrate layers and as a result, the hybrid layer can be protected from the environment.

The low-cost, melt-processed organic-inorganic hybrid materials according to the present invention can be used in a variety of applications, including flat panel displays, non-linear optical/photoconductive devices, chemical sensors, emitting and charge transporting layers in organic-inorganic light-emitting diodes, organic-inorganic thin-film transistors and as channel layers in organic-inorganic field-effect transistors.

DETAILED DESCRIPTION OF THE INVENTION

Figure 1:
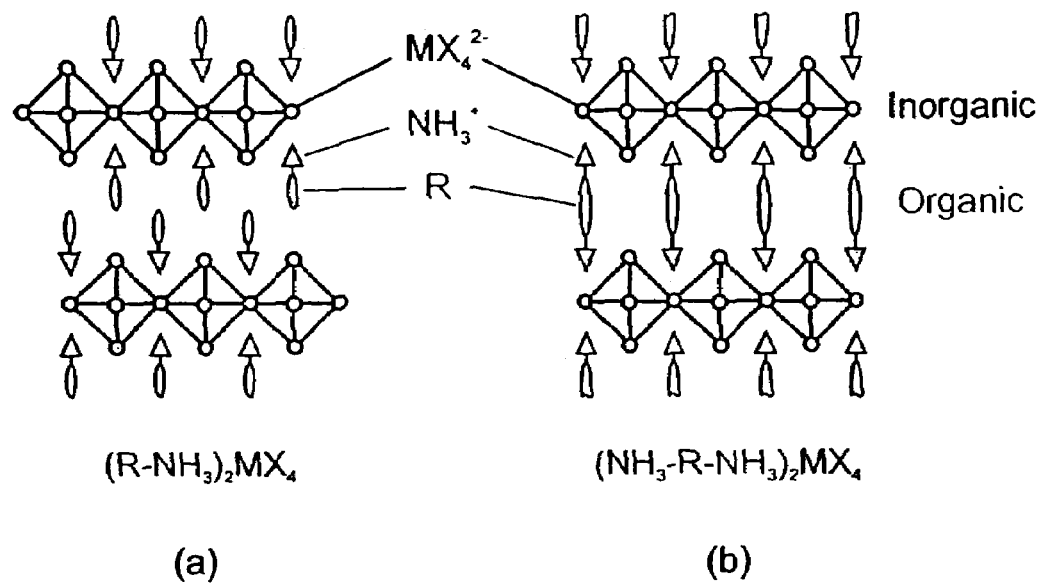
FIG. 1 is a schematic representation of single-layer perovskites with: (a) monoammonium ($RNH_3^+$) or (b) diammonium ($^+H_3NRNH_3^+$) organic cations. M is typically a divalent metal cation and X is a halide ($F^-$, $Cl^-$, $Br^-$ or $I^-$).

Organic-inorganic hybrid materials are a distinct class of materials which enable the combining of the useful characteristics of organic and inorganic components within a single material. Some members of this class of materials exhibit semiconducting characteristics. For the purposes of this description, an organic-inorganic hybrid material is a material composed of organic components and inorganic components which are mixed together on a molecular level, and (i) wherein the material is characterized by a substantially fixed ratio of each organic component to each inorganic component; and (ii) wherein both organic and inorganic components manifest forces that enable a self assembly therebetween into a predictable arrangement.

One example of an organic-inorganic hybrid material takes the form of an organic-inorganic perovskite structure. Layered perovskites may naturally form a quantum well structure in which a two dimensional semiconductor layer of corner sharing metal halide octahedra and an organic layer are alternately stacked.

For preparation of such organic-inorganic hybrid materials, spin coating techniques are often suitable because many organic-inorganic perovskites are soluble in conventional aqueous or organic solvents. Using this method, high quality, highly oriented layered perovskite thin films have been achieved. Vacuum evaporation techniques have also been used to grow films of layered perovskites. The commonly assigned U.S. Pat. Nos. 6,117,498 and 5,871,579 describe alternative deposition methods for organic-inorganic hybrid materials. The disclosure of the aforementioned is incorporated herein by reference. However, none of the methods described in the prior art teach the preparation of melt-processed organic-inorganic hybrid material, including melt-processed organic-inorganic perovskites.

Despite the convenience of solution-processing, potential problems with solubility, surface wetting, and chemical incompatibility between the solvent and hybrid limit the application of these techniques. It is therefore essential to consider other possibilities for film processing, with a special emphasis on those techniques that are compatible with a range of substrate materials and shapes (of particular interest are flexible plastic substrates).

Melt processing has proven very useful for the processing of selected polymeric organic and inorganic materials and provides a natural opportunity to employ roll-to-roll, lamination, capillary filling, and extrusion techniques. For example, a new melt-spinnable dipentylamine-modified polyborazylene precursor to boron nitride ceramic fibers has recently been described (T. Wideman, et. al., Chem. Mater. 8, 3 (1996)). Melt-processing of linear polyethylenes into films has been described (using techniques including extrusion) in U.S. Pat. No. 6,107,454.

In U.S. Pat. No. 4,829,116, a polyolefin molding composition is described with improved extrusion throughput. Japanese Patent Document JP 2000-202,906 describes a process in which molten polymers, including PET, are melt-extruded through a T-die onto a roll whose surface was bead blasted, Cr-coated, and subject to a voltage, to obtain a molding velocity of 84 m/min. In addition, utilization of a melt enables capillary filling between two closely placed substrates, as done in liquid crystal display manufacturing.

Gradual heating of organic-inorganic hybrids might be expected to decompose or dissociate the organic component at a lower temperature than that required for melting. In the metal-halide-based perovskite family $(C_4H_9NH_3)_2MI_4$ (M=Pb, Sn, and Ge), however, the melting temperature progressively decreases across the series from Pb to Ge such that, while both the M=Sn and Pb compounds decompose before or during melting (as is typical for the hybrids), the M=Ge compound forms a reasonably stable melt phase ($T_m$=222° C.).

The present invention provides a process for producing melt-processed organic-inorganic hybrid materials, preferably in the form of a film, a sheet, a thick section, an extrudate or a fiber, using low-temperature melt-processing techniques. The process includes the steps of:

maintaining an organic-inorganic hybrid material at a temperature above the melting point but below the decomposition temperature of the organic-inorganic hybrid material for a period of time sufficient to form a uniform melt; and cooling the uniform melt to an ambient temperature under conditions sufficient to produce the melt-processed organic-inorganic hybrid material.

A melt-processed organic-inorganic hybrid material film according to the present invention can be a single crystal of the organic-inorganic hybrid material. Preferably, the melt-processed organic-inorganic hybrid material is a polycrystalline material having a grain size equal to or greater than the dimensions between contacts in a device, such as, a semiconductor device, in which it is to be used.

One of the requirements of the solid organic-inorganic hybrid material is that it should preferably have a melting point that is below its decomposition temperature, so that it can melt during processing without significant decomposition.

To examine the influence of the organic cation on the thermal properties of isostructural tin(II) iodide based hybrids, $(R-NH_3)_2SnI_4$, several related phenethylammonium-based cations were considered, including, for example, phenethylammonium (PEA), 2-fluorophenethylammonium (2-FPEA), 3-fluorophenethylammonium (3-FPEA), and 2,3,4,5,6-pentafluorophenethylammonium (5FPEA). The four perovskites were prepared as previously reported (Mitzi., D. B.; Dimitrakopoulos, C. D.; Kosbar, L. L. *Chem. Mater.* 2001, 13, 3728).

Each member of the phenethylammonium-based family, $(R-NH_3)_2SnI_4$, where $R-NH_3^+$=2,3,4,5,6-pentafluorophenethylammonium (5FPEA), 3-fluorophenethylammonium (3-FPEA), phenethylammonium (PEA), and 2-fluorophenethylammonium (2-FPEA), was studied using thermal analysis and temperature-programmed powder X-ray diffraction. The melting temperature decreases across the cation series: 253(1)° C. (with partial decomposition) [(5FPEA)$_2$SnI$_4$], 233.0(8)° C. [(3-FPEA)$_2$SnI$_4$], 213.4(8)° C. [(PEA)$_2$SnI$_4$], and 200.8(8)° C. [(2-FPEA)$_2$SnI$_4$], while the bulk decomposition temperatures of the hybrids remain relatively fixed to values between 255-261° C. While the (5FPEA)$_2$SnI$_4$ sample decomposes as it melts, the melt becomes significantly more stable as the temperature of melting transition, $T_b$, decreases across the cation series. Notably, the temperatures of melting and structural transitions during thermal analysis are reproducible with respect to different heating rates, sample size and morphology (crystal versus powder). In contrast, the decomposition temperature depends on how easy it is for the organic material to diffuse from the sample (i.e. for crystals the transition is generally at a higher temperature than for powders).

Before melting, a first-order structural transition is observed, corresponding to a substantial increase in the crystallographic separation between adjacent tin(II) iodide layers. The temperature of this transition tracks approximately 24(3)° C. below the bulk melting point.

The ability to form a stable melt at low temperatures (~200° C.) provides an ideal opportunity to process films of the semiconducting hybrids from the melt on organic-based substrates. Highly crystalline and oriented melt-processed films of the tin(II)-iodide-based perovskites have been prepared on Kapton sheets, providing a convenient pathway for the fabrication of electronic devices (e.g., TFTs and LEDs) on flexible substrates. The ability to laminate the hybrid semiconductors between sheets of plastic may also serve to protect the air-sensitive materials from environmental factors.

The melt-processed organic-inorganic perovskites described above combine the advantages of an inorganic, crystalline semiconductor with those of an organic material. The inorganic component forms an extended, inorganic one-, two-, or three-dimensional network to potentially provide the high carrier mobilities characteristic of inorganic, crystalline solids. The organic component facilitates the self-assembly of these materials. This enables the materials to be applied by simple melt-processing techniques such as those described above. The organic component is also used to tailor the electronic properties of the inorganic framework by defining the dimensionality of the inorganic component and the electronic coupling between inorganic units. Thus, the electronic properties of organic-inorganic hybrid materials may be tailored through chemistry. There is a wide-range of organic and inorganic components usable as the organic-inorganic hybrid material.

The solid organic-inorganic hybrid material should preferably have a melting point that is below its decomposition temperature, so that it can melt during processing without significant decomposition. Also, one or both of the organic and inorganic components of the solid organic-inorganic hybrid material may preferably be semiconducting. Accordingly, materials with desired properties can be designed, for example, by choosing a particular chemistry, crystal structure, and dimensionality of the inorganic component and the length and chemical functionality of the organic component.

The flexibility in the chemistry of organic-inorganic hybrid materials may be used to prepare both n- and p-type transporting materials, which are desirable, for example, for application in complementary logic and normally on- or off-TFTs.

Suitable organic-inorganic hybrid materials include an inorganic anion layer having a metal-ligand framework and an organic cation layer having an organic cation capable of templating the metal-ligand inorganic anion layers within the organic-inorganic hybrid material structure. The metal-ligand framework includes a metal ligand pair, such as, corner-sharing metal ligand octahedra, corner-sharing metal ligand tetrahedra, corner-sharing metal ligand trigonal bipyramids, face-sharing metal ligand octahedra, face-sharing metal ligand tetrahedra, face-sharing metal ligand trigonal bipyramids, edge-sharing metal ligand octahedra, edge-sharing metal ligand tetrahedra or edge-sharing metal ligand trigonal bipyramids. The metal ligand pair can be a metal halide, a metal oxide or a metal sulfide.

Preferably, the organic-inorganic hybrid material is an organic-inorganic perovskite. Perovskites are a subclass of the above described organic-inorganic hybrid materials. They include alternating layers of an inorganic anion layer having a metal halide framework of corner-sharing metal halide octahedra and an organic cation layer having a plurality of organic cations capable of templating the metal halide inorganic anion layers within the perovskite structure. The metal has a valence n in the range of from 2 to 6, the metal halide layer being represented by the formula:

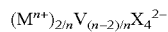

$$(M^{n+})_{2/n}V_{(n-2)/n}X_4^{2-}$$

wherein M is a metal; V is a vacancy; X is a halide; and n is an integer in the range of from 2 to 6.

Preferred metals include $Sn^{2+}$, $Pb^{2+}$, $Ge^{2+}$, $Cu^{2+}$, $Ni^{2+}$, $Co^{2+}$, $Fe^{2+}$, $Mn^{2+}$, $Cr^{2+}$, $V^{2+}$, $Pd^{2+}$, $Cd^{2+}$, $Pt^{2+}$, $Rh^{2+}$, $Eu^{2+}$, $Yb^{2+}$, $Sm^{2+}$, $Bi^{3+}$, $Sb^{3+}$, $In^{3+}$, $Sn^{4+}$, $Te^{4+}$, $Hf^{4+}$, $Nb^{5+}$, $Ta^{5+}$, $Mo^{5+}$ and a combination thereof. More preferred metals include $Sn^{2+}$, $Pb^{2+}$, $Bi^{3+}$, $Sb^{3+}$, $Te^{4+}$ and a combination thereof.

The halide in the metal salt used to prepare the organic-inorganic perovskite of the present invention can be fluoride, chloride, bromide, iodide, or a combination thereof. The preferred halide is iodide. Examples of the trivalent metal iodides include, for example, bismuth(III) iodide, antimony (III) iodide and mixtures thereof.

In order to stabilize the layered perovskite framework with the higher valent metals, it is also necessary to chose an organic counter-cation that will facilitate or template the formation of the characteristic inorganic layers of corner-sharing metal halide octahedra within the perovskite structures. The preferred organic cations include an organic mono-ammonium cation, an organic diammonium cation and a combination thereof.

Accordingly, the perovskite materials of the present invention employ an organic cation, such as an organic diammonium cation, as the organic counter-cation to template and facilitate the formation of the characteristic inorganic anion layers of corner-sharing metal halide octahedra within the perovskite structures. The perovskites will self-assemble by introducing vacancies on the metal site in the correct quantity to counterbalance the larger charge on the metal site. Thus, using such organic diammonium cations produces an organic-inorganic perovskite structure with alternating inorganic anion and organic cation layers.

The organic diammonium cation can be any dication derived from a hydrogen halide and an organic diamine to produce a diammonium salt, such as an organic diammonium dihalide. The organic cation must have an appropriate size and shape to fit within the layered perovskite framework and have intermolecular interactions that favor the formation of the organic-inorganic layered perovskite structures. Preferably, the organic diammonium cation has 2 to 60 carbon atoms, more preferably 6 to 60 carbon atoms, most preferably 10 to 30 carbon atoms.

Preferred examples of such organic di-ammonium cations include 1,2-ethylene diamine, 1,3-propylene diamine, 1,4-butylene diamine, bis-(aminoalkyl)-substituted arylene, bis-(aminoalkyl)-substituted heteroarylene and a combination thereof. Preferably, the diamine has a string of 2-6 aromatic moieties each of which can independently be a phenylene, naphthylene, anthracene, phenanthrene, furan or thiophene. An examples of such organic diammonium cation is obtained by protonation of 5,5'''-bis(aminoethyl)-2,2':5',2'': 5'',2'''-quaterthiophene (AEQT).

Preferred examples of such organic mono-ammonium cations include phenethylammonium, 2-fluorophenethylammonium, 2-chlorophenethylammonium, 2-bromophenethy-lammonium, 3-fluorophenethylammonium, 3-chlorophenethylammonium, 3-bromophenethylammonium, 4-fluorophenethylammonium, 4-chlorophenethylammonium, 4-bromophenethylammonium, 2,3,4,5,6-pentafluorophenethylammonium and a combination thereof.

In a preferred embodiment of the invention, the process includes the steps of applying the solid organic-inorganic hybrid material onto a substrate having a melting and decomposition point above the melting point of the organic-inorganic hybrid material.

Preferably, the substrate is fabricated from a material having at least one property selected from the following: thermally inert, chemically inert, rigid or flexible. Suitable examples include Kapton, silicon, amorphous hydrogenated silicon, silicon carbide (SiC), silicon dioxide ($SiO_2$), quartz, sapphire, glass, diamond-like carbon, hydrogenated diamond-like carbon, gallium nitride, gallium arsenide, germanium, silicon-germanium, indium tin oxide, boron carbide, boron nitride, silicon nitride ($Si_3N_4$), alumina ($Al_2O_3$), cerium(IV) oxide ($CeO_2$), tin oxide ($SnO_2$), zinc titanate (Zn-$TiO_2$), a plastic material and a combination thereof. Preferably, the plastic material is polycarbonate, Mylar or Kevlar.

Preferably, the organic-inorganic hybrid material has a melting point below the melting point or decomposition temperature of the substrate, so that the organic-inorganic hybrid material melts before the substrate melts or decomposes.

Films can be prepared by melting the organic-inorganic hybrid material, for example, on a suitable substrate or container, such as, a crucible, and either allowing the melt to freely flow on the substrate or by confining the melt between the substrate and an overlayer sheet of a chemically and thermally inert material or between two sheets of the inert material, followed by a cooling step.

In the practice of the process of the present invention, the cooling step, which produces the melt-processed organic-inorganic hybrid material, is critical. Preferably, cooling to an ambient temperature is carried out at a rate from about 0.001° C./sec to about 1000° C./sec, preferably by exposing the uniform melt to a temperature gradient for controlling the grain size of the melt-processed organic-inorganic hybrid material. Thus, with slow cooling under the proper cooling conditions, a single crystal film of the melt-processed organic-inorganic hybrid material can be produced, i.e., a melt-processed organic-inorganic hybrid material film including a single crystal of the organic-inorganic hybrid material. Thus, for example, the melt-processed organic-inorganic hybrid material can be a polycrystalline material preferably having a grain size equal to or greater than the dimensions between contacts in a semiconductor device.

In another embodiment, a melt-processed organic-inorganic hybrid material can be prepared by a process including the steps of:

applying onto a substrate an organic-inorganic hybrid material;

maintaining the substrate and/or the organic-inorganic hybrid material at a temperature above the melting point of the organic-inorganic hybrid material but below the decomposition temperature of the organic-inorganic hybrid material and the substrate for a period of time sufficient to form a uniform melt; and cooling the substrate and/or uniform melt to an ambient temperature under conditions sufficient to form the melt-processed organic-inorganic hybrid material.

The process can further include heating the substrate prior to applying the organic-inorganic hybrid material onto the substrate to a temperature above the melting point of the organic-inorganic hybrid material and/or heating the substrate and the solid organic-inorganic hybrid material to a temperature above the melting point of the organic-inorganic hybrid material but below the decomposition temperature of the organic-inorganic hybrid material and the substrate. In such cases, the organic-inorganic hybrid material preferably has a melting point below the melting point or decomposition temperature of the substrate. However, in all cases, the organic-inorganic hybrid material has a melting point which is below its decomposition temperature.

In another preferred embodiment of the invention, a laminated melt-processed organic-inorganic hybrid material can be prepared by a process, which includes the steps of:

applying onto a substrate an organic-inorganic hybrid material;

maintaining the substrate and/or the organic-inorganic hybrid material at a temperature above the melting point of the organic-inorganic hybrid material but below the decomposition temperature of the organic-inorganic hybrid material and the substrate for a period of time sufficient to form a uniform melt;

laminating a protective layer of a material on the uniform melt to produce a composite structure; and cooling the composite structure to an ambient temperature under conditions sufficient to produce the laminated melt-processed organic-inorganic hybrid material.

Preferably, the laminated protective layer and the substrate are fabricated from the same material. However, they can also be fabricated from different materials. In the case of lamination between sheets of an inert material, the outer sheets can also serve to protect the organic-inorganic hybrid from attack by air or moisture or other chemical contaminants.

Melt-processing can be achieved by a number of approaches known in the art. Accordingly, the present invention provides a process for preparing such melt-processed organic-inorganic hybrid materials including the steps of:

(1) melt-spinning an organic-inorganic hybrid material onto a substrate and cooling the substrate and/or uniform melt to an ambient temperature under conditions sufficient to form the melt-processed organic-inorganic hybrid material;

(2) melt-dipping a substrate into a uniform melt of an organic-inorganic hybrid material to produce a melt-dipped substrate and cooling the melt-dipped substrate to an ambient temperature under conditions sufficient to form the melt-processed organic-inorganic hybrid material;

(3) extruding an organic-inorganic hybrid material through a heated extruder and cooling to an ambient temperature under conditions sufficient to form the melt-processed organic-inorganic hybrid material; or (4) capillary-filling a uniform organic-inorganic hybrid material melt into a narrow space capable of capillary action, with or without the use of vacuum, and cooling to an ambient temperature under conditions sufficient to form the melt-processed organic-inorganic hybrid material.

In the case of the capillary-filling process, the narrow space that is capable of capillary action can be, for example, a capillary tube or a narrow space between two rigid or flexible substrates.

In an example of melt processing, the organic-inorganic films are formed in a nitrogen-filled glovebox by heating (on a temperature-controlled hotplate) an 8 μm thick Kapton sheet approximately 10° C. above the expected melting temperature of the hybrid, placing hybrid crystals or powder on the sheet, and immediately depositing another Kapton sheet on top of the melting materials. The hybrid melt effectively wets the Kapton and capillary action spreads the melt uniformly between the sheets, leading to the formation of a film, the thickness of which depends on the initial quantity of hybrid (generally in the range 0.5-10 μm). Thinner hybrid films can be achieved by application of pressure to the top Kapton sheet during the melt process.

After allowing the film to spread, it is cooled below the melting temperature, resulting in a polycrystalline film laminated between the two Kapton sheets. The x-ray diffraction pattern for the $(5FPEA)_2SnI_4$ example indicates substantial decomposition during the melting process, while the $(3-FPEA)_2SnI_4$ sample has a slightly shifted spacing between the inorganic sheets relative to the bulk solution-grown crystals (16.63 Å vs. 16.79 Å), presumeably due to the proximity of the melting and decomposition transitions.

The diffraction patterns for the two lower melting point films based on $(PEA)_2SnI_4$ and $(2-FPEA)_2SnI_4$ are identical with the initial crystals and the large number of higher order (h 0 0) reflections attest to the preferred orientation and high degree of crystallinity of the films. The resulting Kapton/hybrid/Kapton laminate is flexible and the Kapton sheets serve to partially protect the hybrid materials from the environment (as evidenced by repeated X-ray diffraction scans of the films in air). A higher degree of protection may be afforded by using Kapton sheets coated with a gas/moisture impermeable membrane.

As described above, the organic-inorganic hybrid material is preferably selected from members of the organic-inorganic perovskite family. Such organic-inorganic perovskites include inorganic sheets of corner-sharing metal halide octahedra, alternating with bilayers of organic monoammonium cations or monolayers of diammonium cations (see FIG. 1). The influence of the organic cation on the melting properties may derive from changes in the specific hydrogen bonding interactions between the cation and the inorganic component of the structure, from different packing interactions (e.g., aromatic-aromatic interactions) among the organic cations, or more indirectly from subtle changes in the structure of the inorganic framework induced by the different cations.

Referring to FIG. 1, structures (a) and (b), a schematic representation of single-layer perovskites with: (a) monoammonium $(RNH_3^+)$ and (b) diammonium $(^+H_3NRNH_3^+)$ organic cations are shown. M is typically a divalent metal cation and X is a halide $(F^-, Cl^-, Br^-$ or $I^-)$.

The metal halide sheets typically include divalent metals, including $Cu^{2+}$, $Mn^{2+}$, $Fe^{2+}$, $Ni^{2+}$, $Cd^{2+}$, $Cr^+$, $Sn^{2+}$, $Ge^{2+}$, and $Pb^{2+}$, and halide ions, including $Cl^-$, $Br^-$, and $I^-$. Recently trivalent metals, including $Bi^{3+}$ and $Sb^{3+}$, have also been incorporated within the layered perovskite framework through the appropriate choice of organic cation, which templates the formation of metal-deficient inorganic sheets (D. B. Mitzi, *J. Chem. Soc., Dalton Trans.*, 1 (2001)). Single and multiple inorganic layers can be sandwiched between the organic cation layers (enabling control over the effective dimensionality of the inorganic framework) (FIG. 2).

Figure 2:
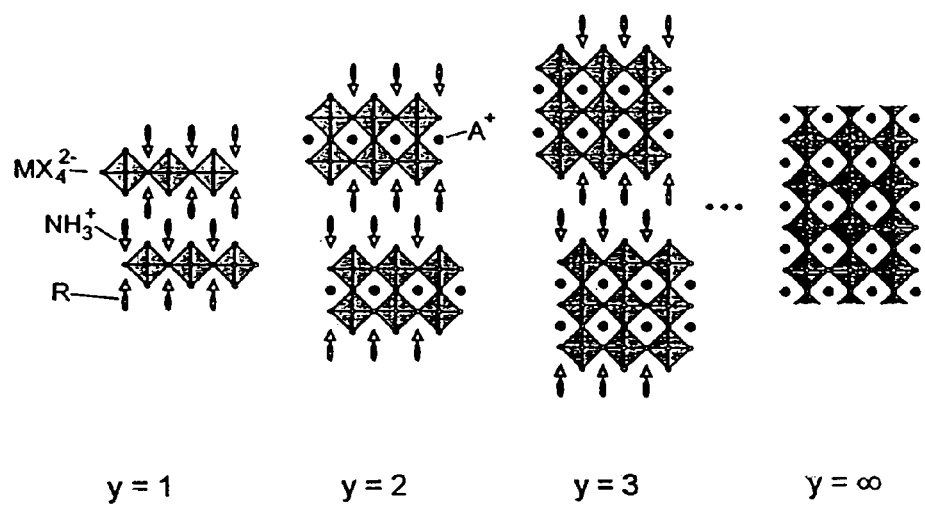
FIG. 2 is a schematic representation of the <100>-oriented family of layered organic-inorganic perovskites, $(RNH_3)_2 A_{y-1}M_yX_{3y+1}$, where R is an organic group, $A^+$ is a small organic cation (e.g. methylammonium), M is generally a divalent metal cation, X is a halide (e.g., $F^-$, $Cl^-$, $Br^-$, or $I^-$), and y defines the thickness of the inorganic layers.

FIG. 2 is a schematic representation of the <100>-oriented family of layered organic-inorganic perovskites, $(RNH_3)_2 A_{y-1}M_yX_{3y+1}$, where R is an organic group, $A^+$ is a small organic cation (e.g. methylammonium), M is generally a divalent metal cation, X is a halide (e.g., $Cl^-$, $Br^-$, $I^-$), and y defines the thickness of the inorganic layers.

These structures are conceptually derived from the three-dimensional cubic perovskite structure by taking y-layer-thick cuts from the three-dimensional structure along the <100> crystallographic direction and stacking these layers in alternation with organic cation bilayers. The crystallographic orientation of the inorganic sheets can also be controlled, e.g., <110>- or <111>-oriented inorganic layers versus the <100>-oriented layers in FIG. 2, through the appropriate choice of organic cation (D. B. Mitzi, *J. Chem. Soc., Dalton Trans.*, 1 (2001)).

One particularly interesting family of layered organic-inorganic perovskites is based on tin(II) iodide sheets. In contrast to most metal halides, which are insulating, the tin(II) iodide based perovskites exhibit semiconducting and even metallic character.

The family $(C_4H_9NH_3)_2(CH_3NH_3)_{y-1}Sn_yI_{3y+1}$, for example, exhibits a semiconductor-metal transition as a function of increasing thickness of the perovskite sheets (controlled by y) (D. B. Mitzi, et. al., *Nature* 369, 467 (1994)). The Hall effect mobility for pressed pellet samples of the cubic perovskite $CH_3NH_3SnI_3$ is ~50 cm$^2$N-sec (D. B. Mitzi, et. al., *J. Solid State Chem.* 114, 159 (1995)). Given appropriate thin film deposition techniques, these alternative semiconductors therefore present important opportunities with respect to semiconductor device applications. Spin-coated thin films of $(C_6H_5C_2H_4NH_3)_2SnI_4$ and related semiconducting hybrid perovskites, for example, exhibit field-effect mobilities and on-off ratios of ~1 cm$^2$N-sec and >10$^5$, respectively, comparable to the values achieved for amorphous silicon (C. R. Kagan, et. al., *Science* 286, 945 (1999)).

While melt processing is useful for selected organic materials, gradual heating of organic-inorganic hybrids is generally expected to lead to the decomposition or dissociation of the organic component at a lower temperature than that required for melting the hybrid (M. J. Tello, et. al., *Thermochim. Acta* 11, 96 (1975)), thereby inhibiting the ability to process these materials using melting techniques. The hybrid perovskite $(C_4H_9NH_3)_2GeI_4$ melts at 222° C., as one of the only previously known examples of hybrid perovskites that melt before decomposition. However, the corresponding Sn(II) analog, $(C_4H_9NH_3)_2SnI_4$, melts and decomposes at approximately the same temperature (D. B. Mitzi, *Chem. Mater.*, 8, 791 (1996)).

Figure 3:
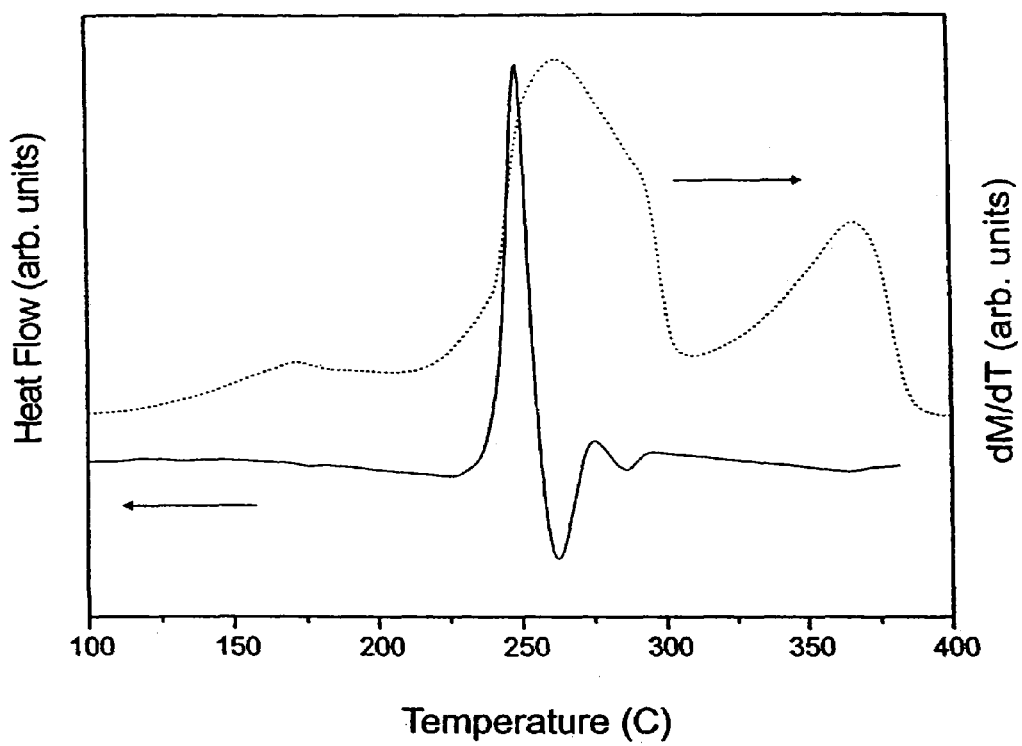
FIG. 3 shows differential scanning calorimetry (solid line) and thermogravimetric analysis (dashed line) plots for $(C_6H_{13}NH_3)_2SnI_4$. Exothermal transitions are up along the heat flow axis. M is the sample mass and T is the sample temperature. Scans were performed in a nitrogen atmosphere using a ramp rate of 5° C./min.

FIG. 3 shows differential scanning dalorimetry (solid line) and thermogravimetric analysis (dashed line) plots for $(C_6H_{13}NH_3)_2SnI_4$. Exothermal transitions are up along the heat flow axis. M is the sample mass and T is the sample temperature. Scans were performed in a nitrogen atmosphere using a ramp rate of 5° C./min.

The thermal analysis of the layered perovskite $(C_6H_{13}NH_3)_2SnI_4$ (FIG. 3) indicates that the hybrid decomposes or dissociates at a lower temperature than that required for melting. This is evident both by the large exotherm at ~225° C. and the corresponding weight loss, which correlates with this transition (i.e., see dM/dT plot). No organic cation-dependence to the melting properties has been previously noted and, in particular, it has not been possible to melt-process the useful class of tin(II) iodide based organic-inorganic perovskites.

Figure 4:
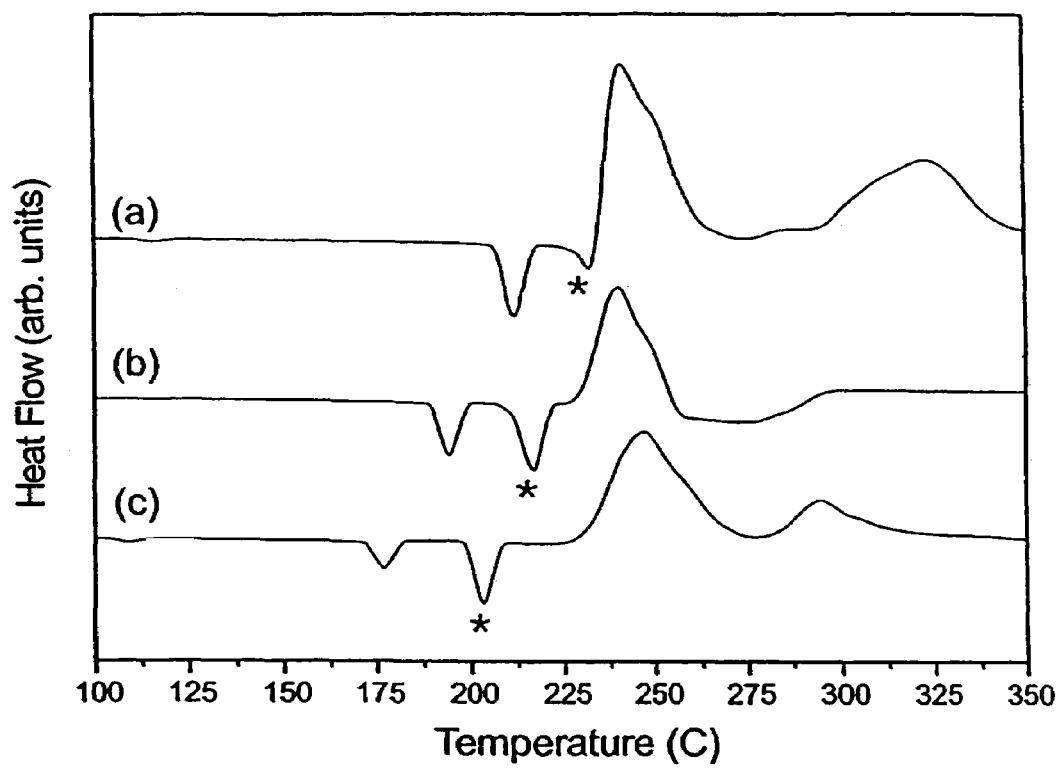
FIG. 4 shows differential scanning calorimetry scans for: (a) $(3-FPEA)_2SnI_4$, (b) $PEA_2SnI_4$, and (c) $(2-FPEA)_2SnI_4$. Scans were performed in a nitrogen atmosphere using a ramp rate of 5° C./min. Exothermal transitions are up along the heat flow axis. In each scan, the * symbol marks the melting transition peak.

FIG. 4 shows differential scanning calorimetry scans for: (a) $(3\text{-FPEA})_2SnI_4$, (b) $PEA_2SnI_4$, and (c) $(2\text{-FPEA})_2SnI_4$. Scans were performed in a nitrogen atmosphere using a ramp rate of 5° C./min. Exothermal transitions are up along the heat flow axis. In each scan, the * symbol marks the melting transition peak.

In FIG. 4, the differential scanning calorimetry (DSC) scan for the $(3\text{-FPEA})_2SnI_4$ layered perovskite (where 3FPEA=3-fluorophenethylammonium) is shown (a). The first endotherm at 207° C. corresponds to a structural transition. The second endotherm, which merges with the decomposition exotherm at ~225° C., corresponds to the onset of melting. The nature of each of these transitions has been verified using temperature-dependent X-ray scans.

Despite the fact that both the $(C_6H_{13}NH_3)_2SnI_4$ and the $(3\text{-FPEA})_2SnI_4$ structures consist of very similar inorganic sheets of corner-sharing $SnI_6$ octahedra, the thermal behavior (i.e. melting and decomposition properties) are substantially different. In particular, the melting transition in $(3\text{-FPEA})_2SnI_4$ is shifted slightly below the decomposition point of the hybrid. Since the organic cation constitutes the major difference between these two structures, this indicates that the organic cation can be used to control the melting properties of the hybrid. This control derives from the fact that organic cations with different shape and functionality will hydrogen bond to the inorganic framework in a different fashion. Changes in hydrogen bonding between the organic cation and the inorganic layers and in interactions among the organic molecules themselves will, in turn, provide a degree of control over how the material melts or decomposes as a function of temperature.

Based on this, it is possible to tailor the organic cation in such a way so as to reduce the melting temperature. In particular, it is desirable to reduce the melting temperature further below the decomposition temperature of the hybrid material, as well as below that for potential organic-based flexible substrates, to enable melt processing. FIG. 4, (b) and (c) show the DSC scans for $(PEA)_2SnI_4$ and $(2\text{-FPEA})_2SnI_4$, where PEA=phenethylammonium and 2-FPEA=2-fluorophenethylammonium. These compounds are very similar to the $(3\text{-FPEA})_2SnI_4$ compound, except that for the PEA system, the fluorine atom has been removed from the substituted phenethylammonium cation and the 2-FPEA system has the fluorine substitution at a different site on the phenethylammonium cation.

It should be noted that the 3-FPEA and 2-FPEA systems are in fact isostructural (i.e. same space group and cell). Clearly evident in this progression is that the melting temperature shifts to lower temperature and, most significantly, in $(2\text{-FPEA})_2SnI_4$ the melting temperature is reduced substantially below the decomposition temperature.

Figure 5:
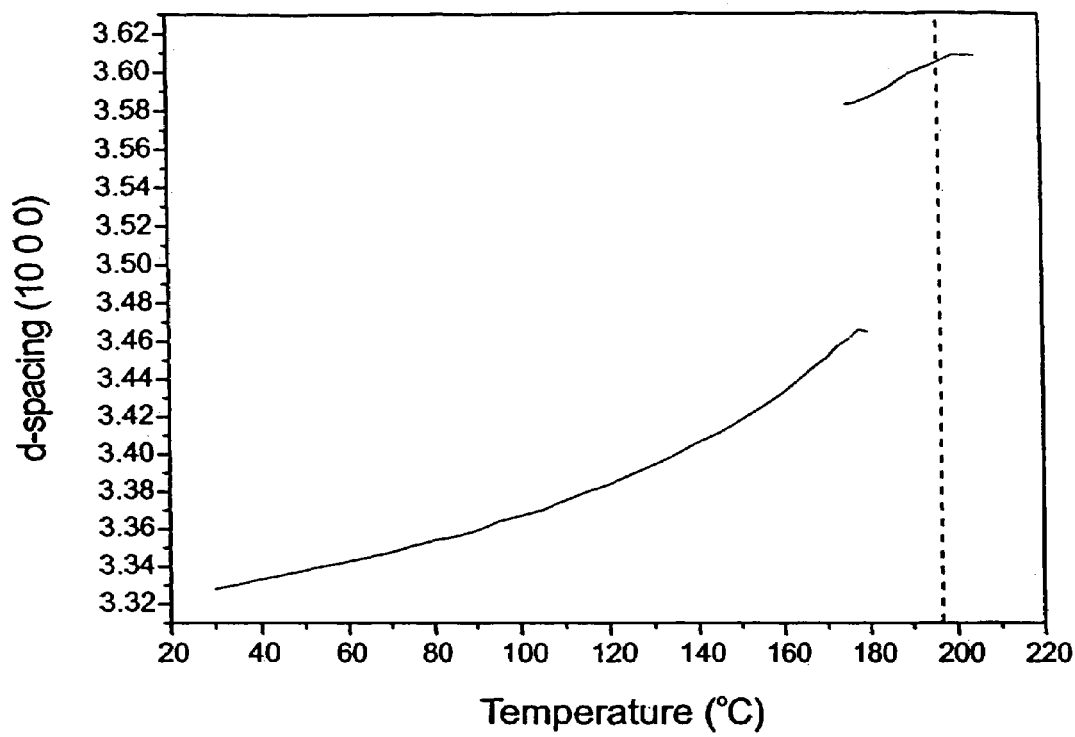
FIG. 5 shows lattice spacing (d-spacing) for the (10 0 0) peak of $(2-FPEA)_2SnI_4$ as a function of temperature, clearly demonstrating the structural transition at 175° C. The diffraction pattern disappears above 200° C. as the sample melts. Data were taken from high temperature X-ray diffraction scans.

FIG. 5 shows lattice spacing (d-spacing) for the (10 0 0) peak of $(2\text{-FPEA})_2SnI_4$ as a function of temperature, clearly demonstrating the structural transition at 175° C. The diffraction pattern disappears above 200° C. as the sample melts. Data were taken from high temperature X-ray diffraction scans. In FIG. 5, the (10 0 0) diffraction X-ray diffraction peak for $(2\text{-FPEA})_2SnI_4$ as a function of temperature clearly indicates the structural and melting transitions. The melting temperature of 199° C. is low enough to enable melt processing on flexible plastic substrates such as Kapton.

Figure 6:
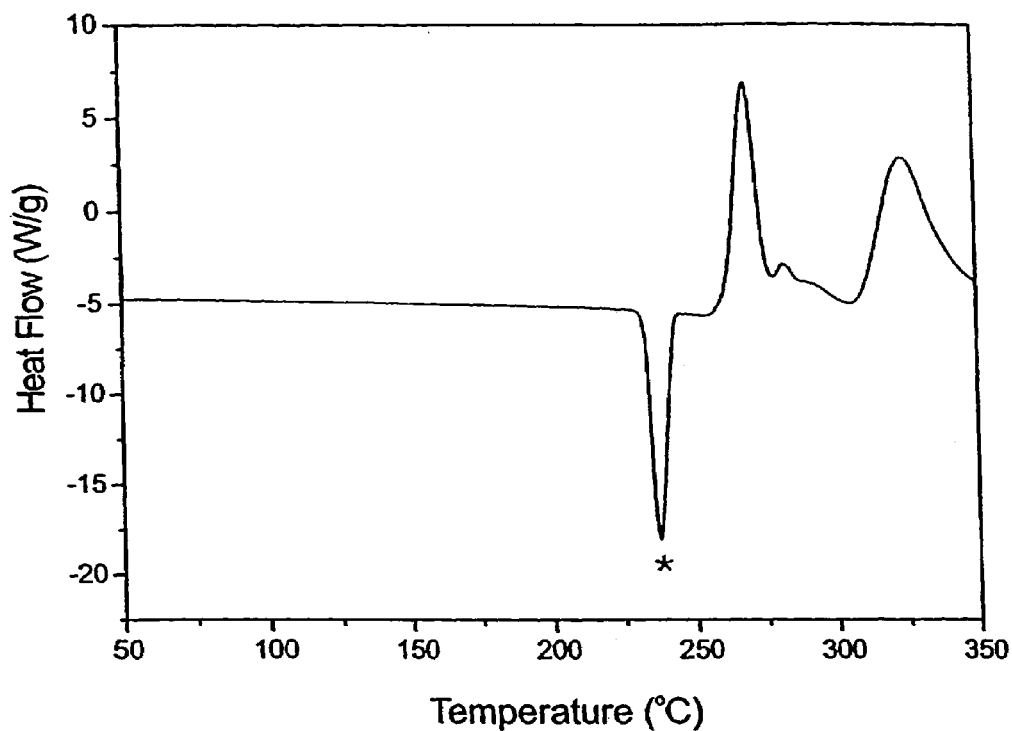
FIG. 6 shows differential scanning calorimetry scan for $(4-FPEA)_2SnI_4$. Scans were performed in a nitrogen atmosphere using a ramp rate of 5° C./min. Exothermal transitions are up along the heat flow axis. The * symbol marks the melting transition.

The corresponding 4-FPEA (4-fluorophenethylammonium) system has a very similar crystallographic cell (although it is not isostructural). The thermal analysis plots for $(4\text{-FPEA})_2SnI_4$ are shown in FIG. 6, i.e., the differential scanning calorimetry scan for $(4\text{-FPEA})_2SnI_4$. Scans were performed in a nitrogen atmosphere using a ramp rate of 5° C./min. Exothermal transitions are up along the heat flow axis. The * symbol marks the melting transition.

In this case, there is no low-temperature structural transition evident. As for the 2-FPEA analog, however, the material melts before it decomposes (although the melting temperature is substantially above that for the 2-FPEA system).

Despite the minor changes to the organic cation in each of these systems, the effect on the thermal properties is important and provides an opportunity for tailoring the thermal properties of the material to enable melt processing. In essence, the organic-inorganic perovskites provide the opportunity to combine the mobility characteristics of the inorganic framework with the structure-directing (and therefore thermal property directing) influence of the organic cation component of the structure. The $SnI_2$ (without the organic cation) melts at 320° C.

Figure 7:
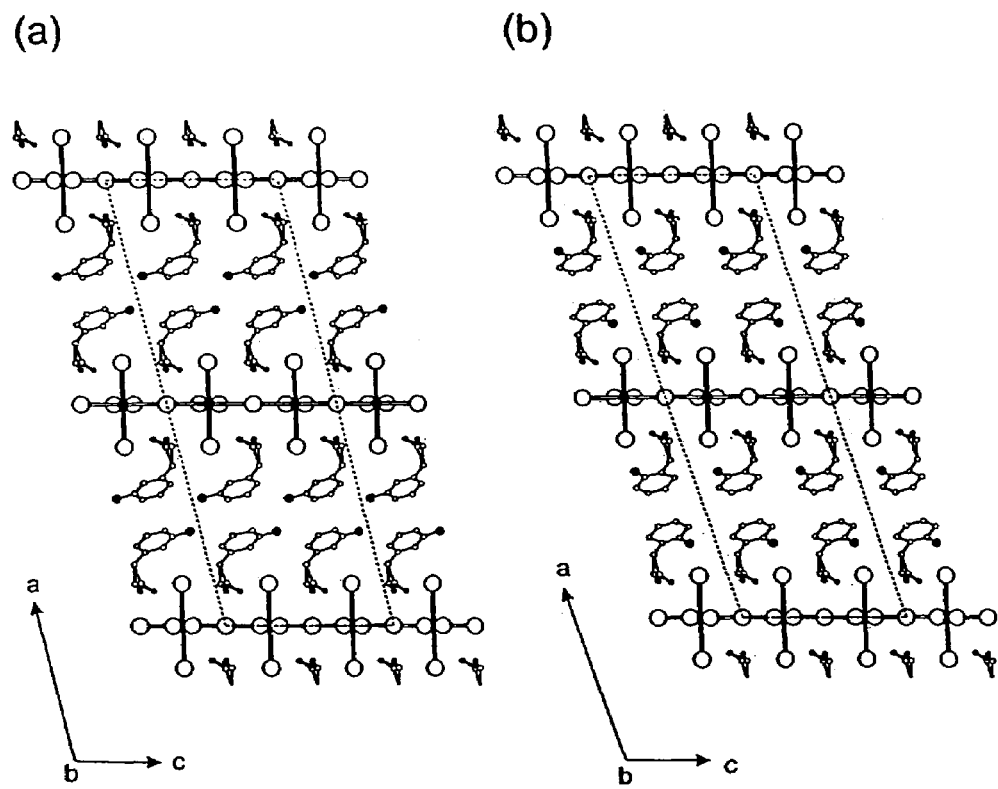
FIG. 7 shows room temperature crystal structure of: (a) $(3-FPEA)_2SnI_4$ and (b) $(2-FPEA)_2SnI_4$, viewed down the b-axis. Dashed lines depict the unit cell outline.

FIG. 7 shows room temperature crystal structure of: (a) $(3\text{-FPEA})_2SnI_4$ and (b) $(2\text{-FPEA})_2SnI_4$, viewed down the b-axis. Dashed lines depict the unit cell outline. In evaluating the potential impact of the organic cation on the crystal structure, the $(2\text{-FPEA})_2SnI_4$ and $(3\text{-FPEA})_2SnI_4$ structures can be used as an example (FIG. 7, structures (a) and (b)) since these two hybrids are isostructural despite the substantially different thermal properties.

At room temperature, the $(3\text{-FPEA})_2SnI_4$ structure adopts a monoclinic (C2/c) structure, with the lattice parameters, a=34.593(4) Å, b=6.0990(8) Å, c=12.254(2) Å, and β=103.917(2)°. The structure consists of two-dimensional sheets of tin(II) iodide octahedra, alternating with bilayers of the 3-FPEA cations. The average tin(II)-iodine bonding distance is 3.160 Å and the average Sn—I—Sn bond angle is 154.2°, indicating that adjacent $SnI_6$ octahedra are substantially tilted relative to each other. The isostructural $(2\text{-FPEA})_2SnI_4$ structure adopts a monoclinic (C2/c) structure, with the lattice parameters, a=35.070(3) Å, b=6.1165(5) Å, c=12.280(1) Å, and β=108.175(1)°. The average Sn—I bond length is 3.159 Å, virtually identical to that found in $(3\text{-FPEA})_2SnI_4$, and the average Sn—I—Sn bond angle is 153.3°, slightly smaller than for the $(3\text{-FPEA})_2SnI_4$ structure. Given the similar inorganic frameworks and related organic cations, the different thermal properties most likely arise from the differences in the interaction between the organic cation and the inorganic framework.

The choice of hydrogen bonding scheme is important for determining the orientation and conformation of the organic molecule within the layered hybrid structure.

Figure 8:
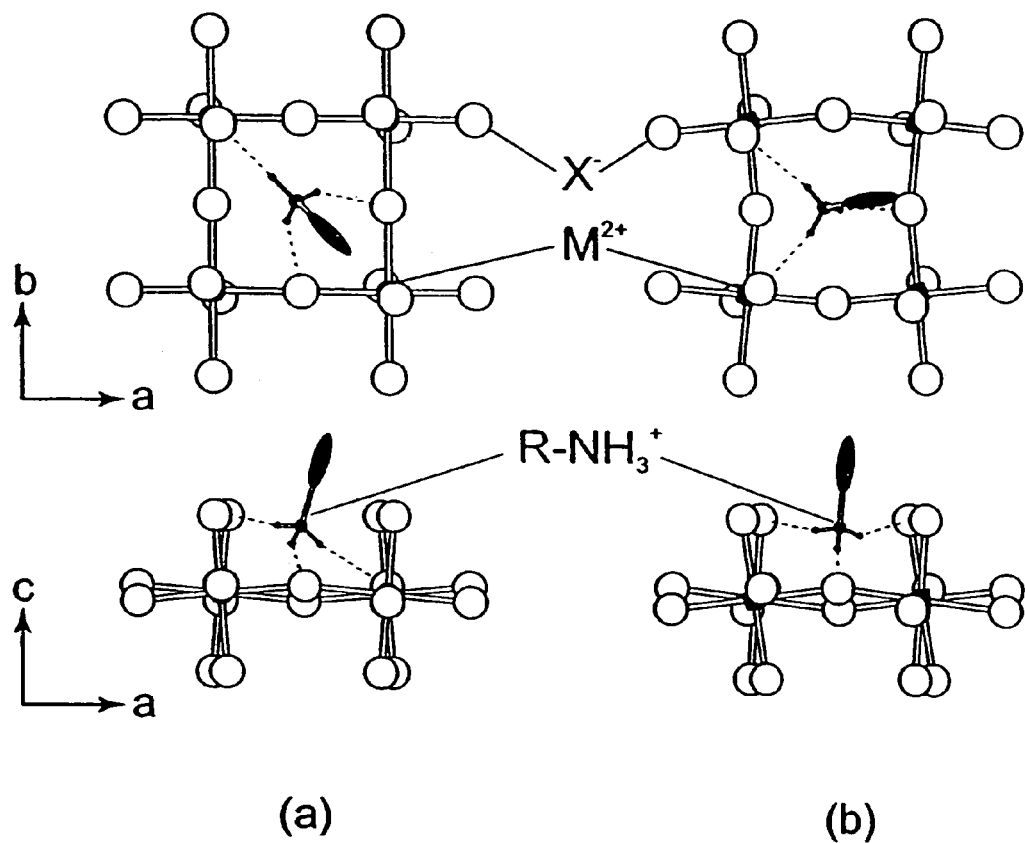
FIG. 8 shows two hydrogen-bonding schemes typically encountered in the $(RNH_3)_2MX_4$ and $(H_3NRNH_3)MX_4$ type structures: (a) the bridging halide configuration and (b) the terminal halide configuration.

FIG. 8 shows two hydrogen-bonding schemes typically encountered in the $(RNH_3)_2MX_4$ and $(H_3NRNH_3)MX_4$ type structures: (a) the bridging halide configuration and (b) the terminal halide configuration.

In principle, the ammonium head(s) of the organic cations can hydrogen bond to any of the eight halides (i.e. four bridging/four terminal) within the holes formed by the corner-sharing $MX_6$ octahedra (FIG. 8, structures (a) and (b)).

In practice, due to the geometric constraints of the ammonium group and the organic tail, the N—H . . . X interactions generally form either primarily to two bridging halogens and one terminal halogen (bridging halogen configuration) or to two terminal halogens and one bridging halogen (terminal halogen configuration). For both the $(3\text{-FPEA})_2SnI_4$ and $(2\text{-FPEA})_2SnI_4$ structures, the phenethylammonium-based organic cations hydrogen bond using the terminal halogen configuration. However, for $(3\text{-FPEA})_2SnI_4$, the average distance between the ammonium nitrogen and the five closest iodides involved with hydrogen bonding is 3.71 Å (the other three iodides are significantly further away and are therefore not significantly involved with hydrogen bonding), whereas for $(2\text{-FPEA})_2SnI_4$, the same distance is 3.77 Å.

The increased hydrogen bonding distance (which presumably correlates with weaker hydrogen bonding) may arise because of the steric interaction between the substituted fluorine and the apical iodides from the tin(II) iodide octahedra. In the $(2\text{-FPEA})_2SnI_4$ system, there is a close interaction between the fluorine and the apical iodide of 3.782(8) Å, whereas there are no close F . . . I interactions for the $(3\text{-FPEA})_2SnI_4$ system. In this way, the choice of organic cation can influence the hydrogen bonding (among other structural factors), and therefore the thermal properties of the solid.

Since the tailored hybrid perovskites can be heated to melting without decomposition, melt-processed films become possible.

Figure 9:
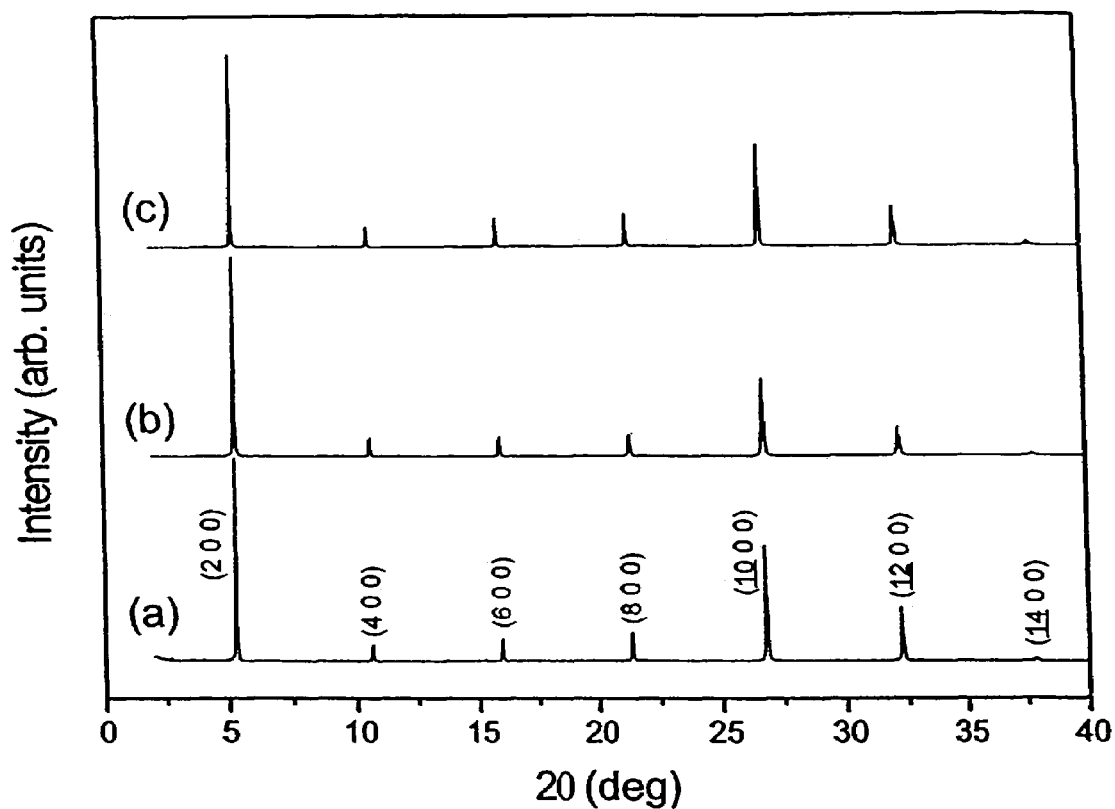
FIG. 9 shows room temperature X-ray diffraction patterns for (a) bulk crystals of $(2-FPEA)_2SnI_4$ laying flat on a glass slide, (b) a deposit of $(2-FPEA)_2SnI_4$ formed on a glass slide by melting crystals of the hybrid on the slide followed by cooling, and (c) a film formed by dipping a Kapton sheet into a melt of $(2-FPEA)_2SnI_4$ and removing it to a room temperature environment. In (a), the indices of the reflections are indicated in parentheses.

FIG. 9 shows room temperature X-ray diffraction patterns for (a) bulk crystals of $(2\text{-FPEA})_2SnI_4$ laying flat on a glass slide, (b) a deposit of $(2\text{-FPEA})_2SnI_4$ formed on a glass slide by melting crystals of the hybrid on the slide followed by cooling, and (c) a film formed by dipping a Kapton sheet into a melt of $(2\text{-FPEA})_2SnI_4$ and removing it to a room temperature environment. In pattern (a), the indices of the reflections are indicated in parentheses.

FIG. 9, pattern (b), shows the X-ray diffraction pattern for a deposit that was created by melting an array of $(2\text{-FPEA})_2SnI_4$ crystals on a glass substrate at 205° C. and allowing the melt to freely flow before cooling. Note that, as for the bulk crystals, only (2h 0 0) reflections are observed, indicating that the film is highly oriented with the plane of the perovskite sheets parallel to the glass substrate. The many orders of reflection that are observed indicate the high degree of crystallinity of the deposits.

FIG. 9, pattern (c) shows the X-ray diffraction pattern for a Kapton sheet, which has been dipped in a melt of the $(2\text{-FPEA})_2SnI_4$ hybrid held at 220° C. and immediately removed. Notice that, in each case, the melt-processed deposits are the same material and of similar crystalline quality as the bulk $(2\text{-FPEA})_2SnI_4$ crystals (FIG. 9, pattern (a)).

Figure 10:
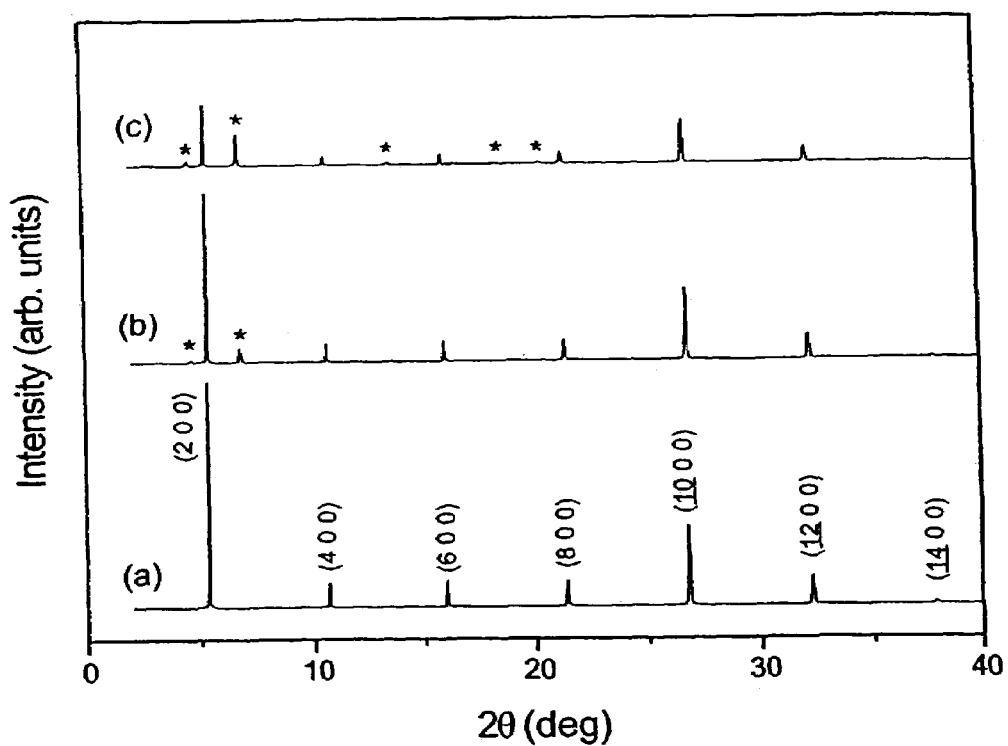
FIG. 10 shows room temperature X-ray diffraction patterns for: (a) a melt-processed film of $(2-FPEA)_2SnI_4$ on a Kapton sheet, and the same film exposed to air for (b) 12 hours and (c) 24 hours. In pattern (a), the indices of the reflections are indicated in parentheses. The * symbol indicates the location of impurity peaks that develop during exposure to air.

FIG. 10 shows room temperature X-ray diffraction patterns for: (a) a melt-processed film of $(2\text{-FPEA})_2SnI_4$ on a Kapton sheet, and the same film exposed to air for pattern (b) 12 hours and pattern (c) 24 hours. In pattern (a), the indices of the reflections are indicated in parentheses. The * symbol indicates the location of impurity peaks that develop during exposure to air.

In FIG. 10, pattern (a), a film of $(2\text{-FPEA})_2SnI_4$ was deposited on a thin (0.3 mil/8 μm) Kapton sheet by melting the hybrid on the sheet at 215° C. on a hot plate (in a nitrogen-filled drybox). The film was formed by dropping a second sheet of Kapton on top of the melt, which creates a uniform layer of melt by capillary action, and then by removing the second sheet before cooling. As for the deposit formed on glass and the dipped film, the currently described film is highly crystalline and oriented.

FIG. 10, patterns (b) and (c) show the X-ray diffraction pattern for the same film after 12 and 24 hours exposure to air, respectively. The growth of impurity peaks and reduction in the intensity of the original perovskite peaks attests to the air-sensitivity of the tin(II) iodide based perovskites. Note that after 24 hrs, most of the film has decomposed.

Figure 11:
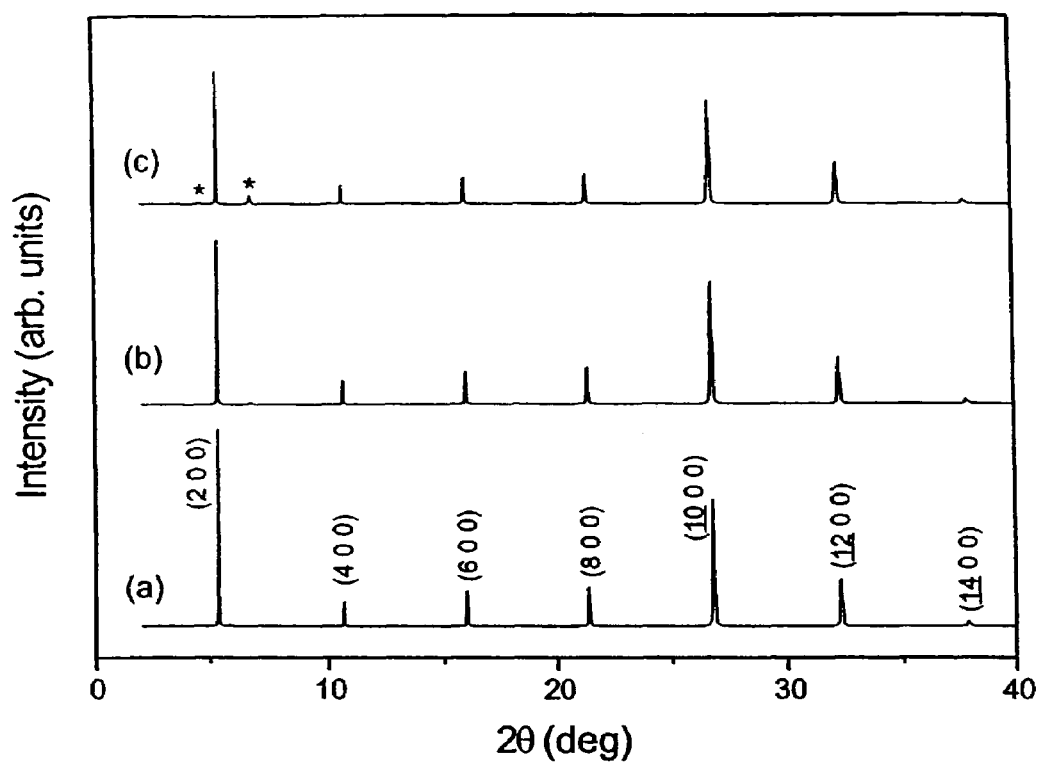
FIG. 11 shows room temperature X-ray diffraction patterns for: (a) a melt-processed film of $(2-FPEA)_2SnI_4$ laminated between two Kapton sheets, and the same film exposed to air for (b) 12 hours and (c) 24 hours. In (a), the indices of the reflections are indicated in parentheses. The * symbol indicates the location of impurity peaks that develop during exposure to air.

FIG. 11, patterns (a), (b) and (c) show room temperature X-ray diffraction patterns for: (a) a melt-processed film of $(2\text{-FPEA})_2SnI_4$ laminated between two Kapton sheets, and the same film exposed to air for (b) 12 hours and (c) 24 hours. In (a), the indices of the reflections are indicated in parentheses. The * symbol indicates the location of impurity peaks that develop during exposure to air.

As shown in FIG. 11, an X-ray diffraction experiment was performed for a film of $(2\text{-FPEA})_2SnI_4$ that was formed by leaving the second Kapton sheet on top of the melt and cooling the laminated melt by shutting off the hot plate. The Kapton/$(2\text{-FPEA})_2SnI_4$/Kapton laminated hybrid film exhibits the same diffraction pattern as the film with a Kapton sheet on only one side. However, the 12 hr and 24 hr air exposure patterns for the laminated film indicate that the film is significantly less susceptible to decomposition in air.

It should be noted that the sides of the laminated structure were not sealed in the current experiment. Therefore, it is expected that the decomposition could be further slowed by sealing the sides of the Kapton/(2-FPEA)$_2$SnI$_4$/Kapton assembly. In addition, a natural extension of these results would be to use Kapton sheets that are coated with some barrier material to prevent diffusion of air, moisture or other deleterious molecular species from reaching the sample. Finally, the Kapton/(2-FPEA)$_2$SnI$_4$/Kapton assembly could be bent and flexed with no apparent degradation of the hybrid material (i.e., macroscopic cracks and delamination).

The melt-processing techniques, enabled by the tailored organic-inorganic hybrids, are not limited to the thin film deposition techniques discussed in the embodiments presented above. As for melt-processable organic polymeric materials, the organic-inorganic hybrids can also be processed using other thin film and fiber techniques know to the field, including melt spinning, extrusion and roll-to-roll processing. In addition, while the technique is demonstrated with organic-inorganic perovskites, other organic-inorganic hybrids, with appropriately tailored organic and inorganic frameworks, could also be processed using the techniques described herein.

The present invention further provides a thin film field-effect transistor (FET) having a melt-processed organic-inorganic hybrid material as the active semiconductor layer.

Field-effect transistors (FET) that use organic-inorganic hybrid materials as the active semiconductor layer are well known in the art. For example, such field-effect transistors (FET) that use organic-inorganic hybrid materials are described in the commonly owned U.S. Pat. No. 6,180,956, the contents of which are incorporated herein by reference. However, the organic-inorganic hybrid materials used in this patent is not melt-processed organic-inorganic hybrid materials.

Accordingly, the present invention provides a method of preparing an improved field-effect transistor of the type having a source region and a drain region, a channel layer extending between the source region and the drain region, the channel layer including a semiconducting organic-inorganic hybrid material, a gate region disposed in spaced adjacency to the channel layer, an electrically insulating layer between the gate region and the source region, drain region and channel layer, wherein the improvement includes:

preparing a channel layer including a melt-processed semiconducting organic-inorganic hybrid material by a process including the steps of:

maintaining an organic-inorganic hybrid material at a temperature above the melting point but below the decomposition temperature of the organic-inorganic hybrid material for a period of time sufficient to form a uniform melt; and cooling the uniform melt to an ambient temperature under conditions sufficient to produce the melt-processed organic-inorganic hybrid material.

In one embodiment, the source region, channel layer and drain region are preferably disposed upon a surface of a substrate, the electrically insulating layer is disposed over the channel layer and extending from the source region to the drain region, and the gate region is disposed over the electrically insulating layer, for example, as shown in FIG. 4 of the previously incorporated U.S. Pat. No. 6,180,956.

In another embodiment, the gate region is disposed as a gate layer upon a surface of a substrate, the electrically insulating layer is disposed upon the gate layer, and the source region, channel layer, and drain region are disposed upon the electrically insulating layer, for example, as shown in FIG. 3 of the previously incorporated U.S. Pat. No. 6,180,956.

Preferably, the melt-processed organic-inorganic hybrid material is in the form of a film, i.e., an organic-inorganic hybrid material film in which the organic-inorganic hybrid material is a polycrystalline material having a grain size equal to or greater than the dimensions between contacts in the semiconductor device. Accordingly, the present invention can provide an improved field-effect transistor prepared by the aforementioned method.

The processes described herein are useful in creating semiconductor films for applications including, for example, thin-film transistors (TFTs) and light-emitting devices (LEDs).

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

The invention claimed is:

1. A method of preparing an improved field-effect transistor of the type having a source region and a drain region, a channel layer extending between the source region and the drain region, the channel layer including a semiconducting organic-inorganic hybrid material, a gate region disposed in spaced adjacency to the channel layer, an electrically insulating layer between the gate region and the source region, drain region and channel layer, wherein the improvement comprises:

preparing a channel layer comprising a melt-processed semiconducting organic-inorganic hybrid material by a process comprising the steps of:

maintaining a solid organic-inorganic hybrid material at a temperature above the melting point but below the decomposition temperature of said organic-inorganic hybrid material for a period of time sufficient to form a uniform melt; and cooling said uniform melt to an ambient temperature under conditions sufficient to produce said melt-processed organic-inorganic hybrid material.

2. The method of claim 1, wherein said source region, channel layer and drain region are disposed upon a surface of a substrate, said electrically insulating layer is disposed over said channel layer and extending from said source region to said drain region, and said gate region is disposed over said electrically insulating layer.

3. The method of claim 1, wherein said gate region is disposed as a gate layer upon a surface of a substrate, said electrically insulating layer is disposed upon said gate layer, and said source region, channel layer, and drain region are disposed upon said electrically insulating layer.

4. The method of claim 1, wherein said melt-processed organic-inorganic hybrid material is in the form of a film.

5. The method of claim 4, wherein said melt-processed organic-inorganic hybrid material film comprises a single crystal of said organic-inorganic hybrid material.

6. The process of claim 4, wherein said said melt-processed organic-inorganic hybrid material is a polycrystalline material having a grain size equal to or greater than the dimensions between contacts in a semiconductor device.

7. The method of claim 1, wherein said organic-inorganic hybrid material has a melting point below its decomposition temperature.

8. The method of claim 1, wherein said organic-inorganic hybrid material comprises:
an inorganic anion layer having a metal-ligand framework; and
an organic cation layer having an organic cation capable of templating said metal-ligand inorganic anion layers within the organic-inorganic hybrid material structure.

9. The method of claim 8, wherein said metal-ligand framework comprises a metal ligand pair selected from the group consisting of: corner-sharing metal ligand octahedra, corner-sharing metal ligand tetrahedra, corner-sharing metal ligand trigonal bipyramids, face-sharing metal ligand octahedra, face-sharing metal ligand tetrahedra, face-sharing metal ligand trigonal bipyramids, edge-sharing metal ligand octahedra, edge-sharing metal ligand tetrahedra and edge-sharing metal ligand trigonal bipyramids.

10. The method of claim 9, wherein said metal ligand pair is selected from the group consisting of: metal halide, metal oxide and metal sulfide.

11. The method of claim 8, wherein said organic-inorganic hybrid material is an organic-inorganic perovskite, comprising alternating layers of:
an inorganic anion layer having a metal halide framework of corner-sharing metal halide octahedra, wherein said metal has a valence n in the range of from 2 to 6, said metal halide layer being represented by the formula:

$(M^{n+})_{2/n} V_{(n-2)/n} X_4^{2-}$ wherein M is a metal; V is a vacancy; X is a halide; and n is an integer in the range of from 2 to 6; and
an organic cation layer having a plurality of organic cations capable of templating said metal halide inorganic anion layers within the perovskite structure.

12. The method of claim 11, wherein said metal is selected from the group consisting of $Sn^{2+}$, $Pb^{2+}$, $Ge^{2+}$, $Cu^{2+}$, $Ni^{2+}$, $Co^{2+}$, $Fe^{2+}$, $Mn^{2+}$, $Cr^{2+}$, $V^{2+}$, $Pd^{2+}$, $Cd^{2+}$, $Pt^{2+}$, $Rh^{2+}$, $Eu^{2+}$, $Yb^{2+}$, $Sm^{2+}$, $Bi^{3+}$, $Sb^{3+}$, $In^{3+}$, $Sn^{4+}$, $Te^{4+}$, $Hf^{4+}$, $Nb^{5+}$, $Ta^{5+}$, $Mo^{5+}$ and a combination thereof.

13. The method of claim 12, wherein said metal is selected from the group consisting of $Sn^{2+}$, $Pb^{2+}$, $Bi^{3+}$, $Sb^{3+}$, $Te^{4+}$ and a combination thereof.

14. The method of claim 11 wherein said halide is iodide.

15. The method of claim 11, wherein said organic cation is selected from the group consisting of: an organic monoammonium cation, an organic diammonium cation and a combination thereof.

16. The method of claim 15, wherein said organic monoammonium cation is selected from the group consisting of: phenethylammonium, 2-fluorophenethylammonium, 2-clorophenethylammonium, 2-bromophenethylammonium, 3-fluorophenethylammonium, 3-clorophenethylammonium, 3-bromophenethylammonium, 4-fluorophenethylammonium, 4-clorophenethylammonium, 4-bromophenethylammonium, 2,3,4,5,6-pentafluorophenethylammonium and a combination thereof.

17. The method of claim 15, wherein said organic diammonium cation is derived from a diamine selected from the group consisting of: 1,2-ethylene diamine, 1,3-propylene diamine, 1,4-butylene diamine, bis-(aminoalkyl)-substituted arylene, bis-(aminoalkyl)-substituted heteroarylene and a combination thereof.

18. The method of claim 17, wherein said diamine has a string of 2-6 aromatic moieties each independently selected from the group consisting of: phenelene, naphthylene, anthracene, phenanthrene, furan and thiophene.

19. The method of claim 15, wherein said organic diammonium cation is obtained by protonation of 5,5'''-bis(aminoethyl)-2,2':5',2'':5'',2'''-quaterthiophene.

20. The method of claim 1, wherein said cooling to an ambient temperature is carried out at a rate from about 0.001° C./sec to about 1000° C./sec.

21. The method of claim 20, wherein said cooling to an ambient temperature is carried out by exposing said uniform melt to a temperature gradient for controlling the grain size of said laminated melt-processed organic-inorganic hybrid material.

22. An improved field-effect transistor prepared by the method of claim 1.

* * * * *